United States Patent
Okazaki et al.

(10) Patent No.: US 9,117,896 B2
(45) Date of Patent: Aug. 25, 2015

(54) SEMICONDUCTOR DEVICE WITH IMPROVED CONDUCTIVITY

(71) Applicant: Mitsubishi Electric Corporation, Tokyo (JP)

(72) Inventors: Hiroyuki Okazaki, Tokyo (JP); Yoshitaka Kamo, Tokyo (JP); Yoichi Nogami, Tokyo (JP); Hidetoshi Koyama, Tokyo (JP); Shinichi Miyakuni, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/295,532

(22) Filed: Jun. 4, 2014

(65) Prior Publication Data
US 2015/0084103 A1   Mar. 26, 2015

(30) Foreign Application Priority Data
Sep. 24, 2013 (JP) .................. 2013-197261

(51) Int. Cl.
| H01L 29/76 | (2006.01) |
| H01L 29/78 | (2006.01) |
| H01L 29/66 | (2006.01) |
| H01L 29/417 | (2006.01) |
| H01L 29/423 | (2006.01) |
| H01L 29/778 | (2006.01) |
| H01L 29/20 | (2006.01) |

(52) U.S. Cl.
CPC ............ *H01L 29/78* (2013.01); *H01L 29/4175* (2013.01); *H01L 29/41758* (2013.01); *H01L 29/42316* (2013.01); *H01L 29/66522* (2013.01); *H01L 29/7787* (2013.01); *H01L 29/2003* (2013.01)

(58) Field of Classification Search
None
See application file for complete search history.

(56) References Cited

U.S. PATENT DOCUMENTS

| 2011/0057235 A1* | 3/2011 | Shim ............................ 257/194 |
| 2012/0049955 A1* | 3/2012 | Minoura ...................... 330/250 |
| 2014/0091366 A1* | 4/2014 | Jeon et al. .................... 257/195 |

FOREIGN PATENT DOCUMENTS

| JP | 2009-206142 A | 9/2009 |
| JP | 2010-67662 A | 3/2010 |

* cited by examiner

*Primary Examiner* — Bilkis Jahan
(74) *Attorney, Agent, or Firm* — Leydig, Voit & Mayer, Ltd.

(57) ABSTRACT

A semiconductor device includes: a Si substrate having first and second major surfaces facing in opposite directions; a buffer layer of $Al_xGa_{1-x}N$ ($0 \leq x \leq 1$) on the first major surface of the Si substrate; an epitaxially grown crystalline layer of $Al_yGa_{1-y}N$ ($0 \leq y \leq 1$, $x \neq y$) on the buffer layer; a transistor on the epitaxially grown crystalline layer; and a filler of $Al_xGa_{1-x}N$ and having the same x as the buffer layer. A through hole in the Si substrate extends from the second major surface to the buffer layer, and the through hole is filled with the filler.

7 Claims, 4 Drawing Sheets

SEMICONDUCTOR DEVICE WITH IMPROVED CONDUCTIVITY

BACKGROUND OF THE INVENTION

1. Field of the Invention

The present invention relates to a field effect transistor formed in an epitaxially grown crystal layer formed of GaN or AlGaN on a Si substrate, and a MMIC including the field effect transistor.

2. Background Art

A semiconductor device is known in which an epitaxially grown crystal layer formed of GaN or AlGaN is formed on a Si substrate, and in which a field effect transistor is formed in the epitaxially grown crystal layer (see, for example, Japanese patent Laid-Open Nos. 2009-206142 and 2010-67662).

SUMMARY OF THE INVENTION

In a conventional semiconductor device, a Si substrate having a thickness of about 100 μm exists below a transistor portion, a pad portion, a wiring portion and a passive circuit portion, with a several micrometer-thick epitaxial layer interposed therebetween, the epitaxial layer comprising GaN or AlGaN. Even the resistivity of a high resistance type of Si substrate is about $10^4$ Ωcm, which is four to five orders of magnitude lower than those of semi-insulating GaAs substrates and SiC substrates used in high-frequency-band semiconductor devices. The conductor loss in a circuit portion is increased thereby.

In ordinary cases, the substrate back surface of a semiconductor device serves as electrical ground. However, a GaN-based epitaxial layer ordinarily has a thickness of about several micrometers. Therefore, in a case where a Si substrate in a semiconductor device has a low resistivity, the stray capacitance between a drain electrode and the substrate back surface (Cds) is larger than that in a semiconductor device using a semi-insulating GaAs substrate or a SiC substrate, and a high-frequency characteristic degrades.

The heat conductivity of Si is about 1.5 W/cm·K, lower than that of SiC used as a substrate in a GaN or AlGaN-based semiconductor device. Therefore, heat generated in a transistor in such a semiconductor device cannot easily be released, and the thermal resistance of the semiconductor device is increased. In the case of use of the semiconductor device as a high-output amplifier in particular, the junction temperature is increased during operation, resulting in a reduction in reliability.

In devices described in Japanese patent Laid-Open Nos. 2009-206142 and 2010-67662, therefore, part of the Si substrate is replaced with a filler having a high insulating property compared with Si and having high heat conductivity to reduce the conductor loss in a circuit portion and limit the increase in stray capacitance in a portion below the transistor (including Cds) so that high-frequency characteristics are improved. Because complete removal of the corresponding portion of the Si substrate is more effective in enabling high-withstand-voltage high-frequency operation, a through hole is formed so as to reach from the back surface of the Si substrate to the epitaxially grown crystal layer and is filled with the filler in the devices described in Japanese patent Laid-Open Nos. 2009-206142 and 2010-67662. However, the lattice constants of the epitaxially grown crystal layer and the filler differ from each other and a defect can occur. It is, therefore, difficult to deposit the filler.

In view of the above-described problems, an object of the present invention is to provide a semiconductor device and a method for manufacturing the same which can reduce the conductor loss in the circuit portion, improve high-frequency characteristics, and easily deposit the filler.

According to the present invention, a semiconductor device includes: a Si substrate having first and second major surfaces facing in opposite directions; a buffer layer formed of $Al_xGa_{1-x}N$ (0≤x≤1) on the first major surface of the Si substrate; an epitaxially grown crystal layer formed of $Al_yGa_{1-y}N$ (0≤y≤1, x≠y) on the buffer layer; a transistor formed on the epitaxially grown crystal layer; and a filler formed of $Al_xGa_{1-x}N$ having the same composition ratio x as a material of the buffer layer, wherein a through hole is formed in the Si substrate so as to reach from the second major surface to the buffer layer, and the through hole is filled with the filler.

In the present invention, a through hole formed in the Si substrate is filled with a filler formed of $Al_xGa_{1-x}N$ having the same composition ratio x as a material of the buffer layer. Therefore, the conductor loss in the circuit portion can be reduced, high-frequency characteristics can be improved, and the filler can be easily deposited.

Other and further objects, features and advantages of the invention will appear more fully from the following description.

DETAILED DESCRIPTION OF THE PREFERRED EMBODIMENTS

A semiconductor device and method for manufacturing the same according to the embodiments of the present invention will be described with reference to the drawings. The same components will be denoted by the same symbols, and the repeated description thereof may be omitted.

First Embodiment

Figure 1:
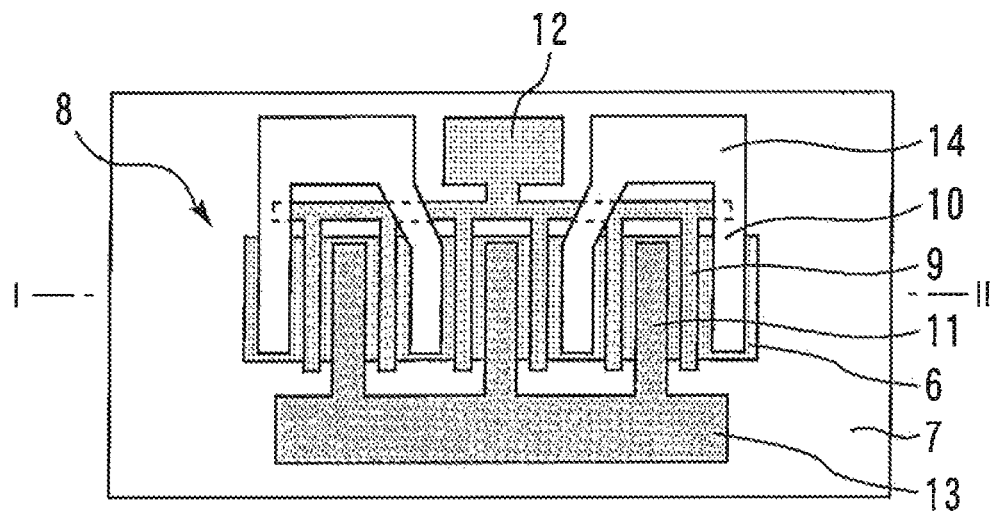
FIG. 1 is a top view of a semiconductor device according to a first embodiment of the present invention.
Figure 2:
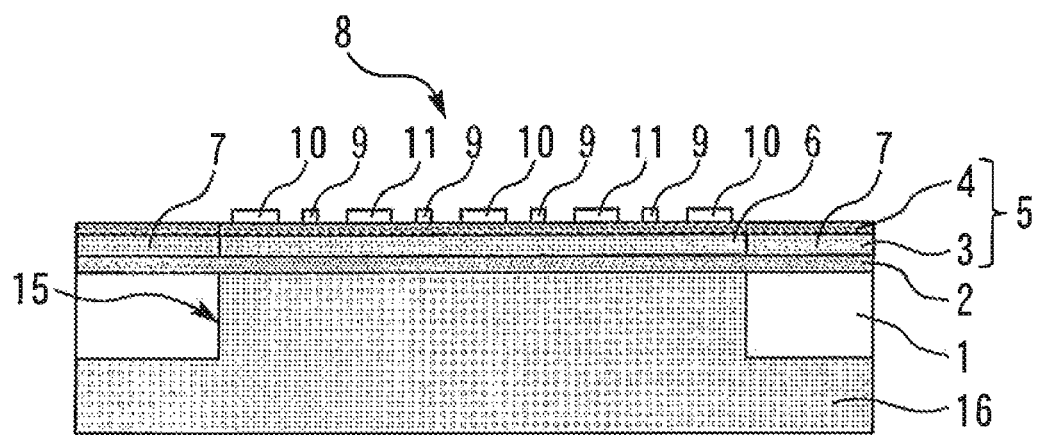
FIG. 2 is a sectional view taken along line I-II in FIG. 1.

FIG. 1 is a top view of a semiconductor device according to a first embodiment of the present invention. FIG. 2 is a sectional view taken along line I-II in FIG. 1. A Si substrate 1 has first and second major surfaces facing in opposite directions. A buffer layer 2 formed of AlN is uniformly formed over the entire area of the first major surface of the Si substrate 1. An epitaxially grown crystal layer 5 including a GaN layer 3 and an AlGaN layer 4 laid one on another is formed on the buffer layer 2.

An active layer region 6 is formed in a portion of the epitaxially grown crystal layer 5, and an insulation region 7 is formed around the active layer region 6 by insulation injection or the like. A transistor 8 is formed in the epitaxially grown crystal layer 5. More specifically, a pair of field-effect transistors having gate electrodes 9, source electrodes 10 and drain electrodes 11 are disposed parallel to each other on the active layer region 6, each gate electrode 9 being interposed between one of the source electrodes 10 and one of the drain electrodes 11. The active layer region 6 and a region where the three kinds of electrodes are arranged parallel to each other form an operating region. At least one gate pad 12 and at least one drain pad 13 are disposed in such positions on opposite sides of the operating region as to be opposed to each other.

All the gate electrodes 9 in the operating region are combined into one outside the operating region to be connected to the gate pad 12. Similarly, all the drain electrodes 11 in the operating region are combined into one outside the operating region to be connected to the drain pad 13. The source electrodes 10 are connected to source pads 14 ordinarily provided by the side of the gate pad 12. Wiring electrodes that connect the source electrodes 10 and the source pads 14 are disposed on the wiring electrode into which the gate electrodes 9 are merged, with an insulating film and air interposed therebetween.

A through hole 15 is formed in the Si substrate 1 so as to reach from the second major surface to the buffer layer 2. The through hole 15 is filled with a filler 16 formed of AlN. The materials of the above-described layers are only an example. The buffer layer 2 is formed of $Al_xGa_{1-x}N$ ($0 \leq x \leq 1$), the epitaxially grown crystal layer 5 is formed of $Al_yGa_{1-y}N$ ($0 \leq y \leq 1$, $x \neq y$), and the filler 16 is formed of $Al_xGa_{1-x}N$ having the same composition ratio x as the material of the buffer layer 2.

A method of manufacturing the above-described semiconductor device will now be described. The AlN buffer layer 2 is first formed on the first major surface of the Si substrate 1. The epitaxially grown crystal layer 5 is formed on the buffer layer 2. The transistor 8 is formed in the epitaxially grown crystal layer 5. The through hole 15 is thereafter formed by an etching process in which the region in the second major surface of the Si substrate 1 other than the region below the active layer region 6 is masked with a resist and the portion of the Si substrate 1 below the active layer region 6 is dry-etched from the second major surface with a fluorine-based gas such as SF6 by using the buffer layer 2 as a stopper layer. The through hole 15 is filled with the AlN filler 16 by using sputtering or CVD.

In the present embodiment, part of the Si substrate is removed and the hole thereby formed is filled with the filler 16 formed of $Al_xGa_{1-x}N$ having a high insulating property compared with Si and having high heat conductivity, thereby reducing the conductor loss in the circuit portion and limiting the increase in stray capacitance below the transistor (including Cds). High-frequency characteristics can thus be improved. Also, heat generated in the transistor 8 can be efficiently released to the metal base of the package through the filler 16. Prevention of reduction in reliability can thus be enabled.

The filler 16 is formed of $Al_xGa_{1-x}N$ having the same composition ratio x as the material of the buffer layer 2. The buffer layer 2 and the filler 16 are thus lattice-matched to each other, so that the filler 16 can easily be deposited.

In the conventional devices, high-resistance Si substrates having resistivities of $10^2$ to $10^4$ Ωcm in order to optimize high-frequency characteristics. In the present embodiment, the region below the transistor, the circuit portion and the wiring portion is filled with a material having a high insulating property. Therefore, even if the resistivity of the Si substrate 1 in the other region is low, it does not affect the high-frequency characteristics of the semiconductor device. As a result, even when the resistivity of the Si substrate 1 is equal to or lower than $10^4$ Ωcm, high-frequency characteristics as good as those in a case where a semi-insulating substrate is used can be obtained.

A semiconductor device used as a high-output amplifier is ordinarily made to operate at a high operating voltage equal to or higher than 10 V in order to obtain a high output. Therefore, a p-type Si substrate 1 may alternatively be used. Use of a p-type Si substrate 1 enables holes generated between the gate and the drain between which a high electric field is applied to be drawn out from the p-type Si substrate 1 below the source electrode 10 to the back surface through a short distance. Holes generated in the transistor at the time of application of the high electric field can thus be inhibited from staying in the epitaxially grown crystal layer below the gate electrode 9 in particular. As a result, the reliability can be improved uniformly with respect to the active layer region 6.

Forming of the through hole 15 by etching the Si substrate 1 using the nitride buffer layer 2 as a stopper layer is easier to perform.

Second Embodiment

Figure 3:
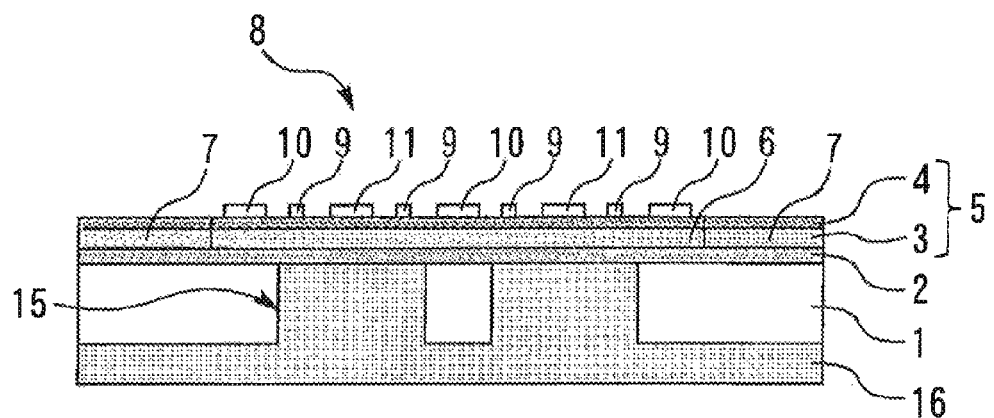
FIG. 3 is a sectional view of a semiconductor device according to a second embodiment of the present invention.

FIG. 3 is a sectional view of a semiconductor device according to a second embodiment of the present invention. In the present embodiment, the through hole 15 and the filler 16 are provided below the drain electrodes 11 of the transistor 8 but not provided below the source electrodes 10.

Since an increase in the capacitance Cds between the drain electrodes 11 and the substrate back surface is a cause of degradation of high-frequency characteristics, part of the Si substrate 1 below the drain electrodes 11 may be removed and replaced with the filler 16. The high-frequency characteristics can be improved thereby, as are those in the first embodiment. While the thickness of the AlN layer deposited as filler 16 is about several micrometers in the first embodiment, the thickness of the AlN layer in the present embodiment can be reduced relative to that in the first embodiment. Forming of the filler 16 is facilitated thereby.

Third Embodiment

Figure 4:
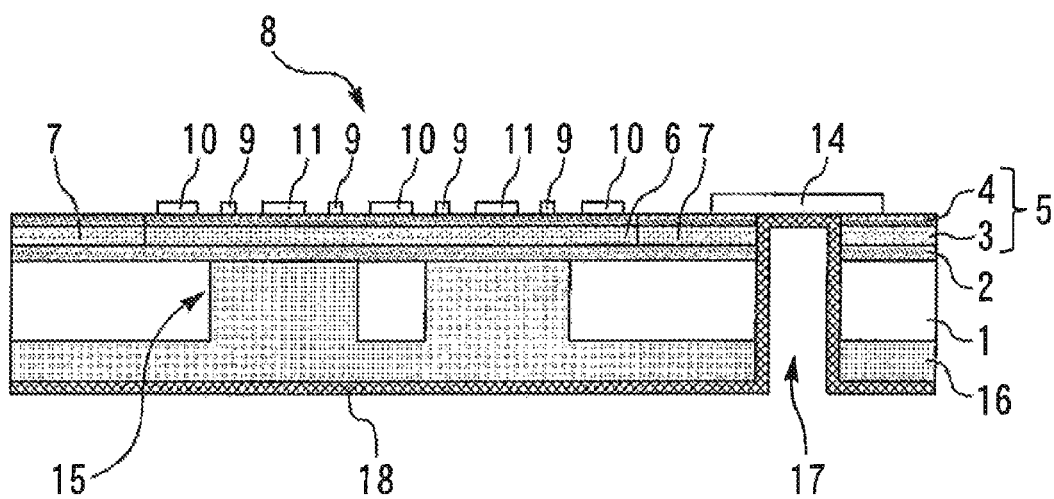
FIG. 4 is a sectional view of a semiconductor device according to a third embodiment of the present invention.

FIG. 4 is a sectional view of a semiconductor device according to a third embodiment of the present invention. A source via hole 17 reaching from the second major surface of the Si substrate 1 to the source pad 14 of the transistor 8 is provided in the insulation region 7. A metal film 18 such as Au plating is provided on the inner wall surface of the source via hole 17 and the second major surface of the Si substrate 1 and is connected to the source pad 14. The distance to a grounding point can be reduced by the metal film 18. The source inductance can thus be reduced to improve the high-frequency characteristics.

Fourth Embodiment

Figure 5:
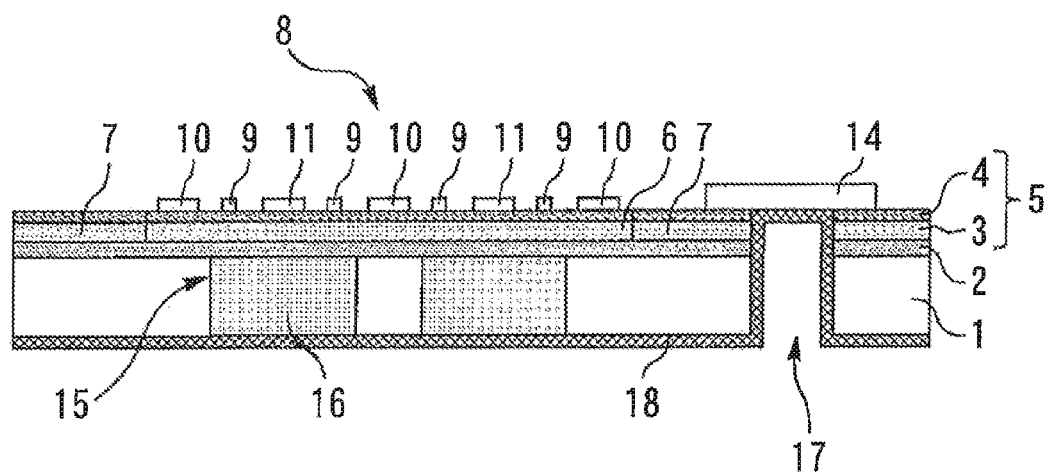
FIG. 5 is a sectional view of a semiconductor device according to a fourth embodiment of the present invention.

FIG. 5 is a sectional view of a semiconductor device according to a fourth embodiment of the present invention. For filling with the filler 16, the filler 16 is first formed on the second major surface of the Si substrate 1 and in the through hole 15. The filler 16 formed on the second major surface of the Si substrate 1 is then cut away and leveled by using grinding, CMP or the like. In a state where the filler 16 is embedded only below the drain electrodes 11, the source via hole 17 is formed. A flat back surface can be formed by cutting away the superfluous AlN on the substrate back surface. A semiconductor device capable of being assembled with facility can thus be obtained.

Fifth Embodiment

Figure 6:
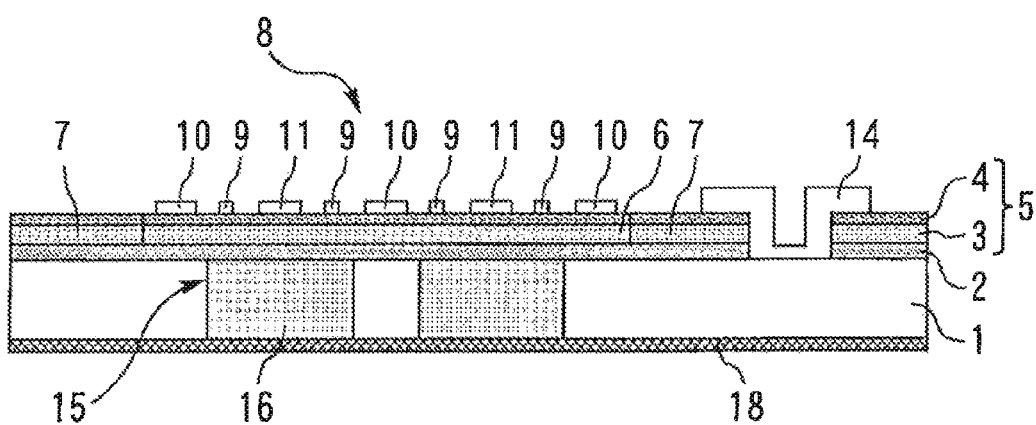
FIG. 6 is a sectional view of a semiconductor device according to a fifth embodiment of the present invention.

FIG. 6 is a sectional view of a semiconductor device according to a fifth embodiment of the present invention. An n-type Si substrate 1 is used. The source pad 14 comes into direct contact with the n-type Si substrate 1 through an opening provided in the buffer layer 2 and the epitaxially grown crystal layer 5 in the insulation region 7 immediately below the source pad 14. The source pad 14 on the surface is thereby connected to the metal film 18 on the substrate back surface through the n-type Si substrate 1; the need for the source via hole 17 is eliminated. The semiconductor device manufacturing process can thus be simplified while the same advantages as those in the fourth embodiment are ensured.

Sixth Embodiment

Figure 7:
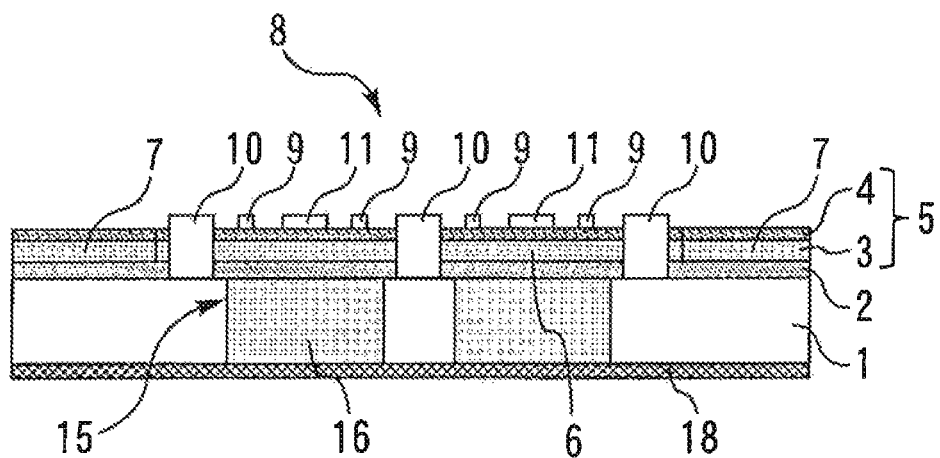
FIG. 7 is a sectional view of a semiconductor device according to a sixth embodiment of the present invention.

FIG. 7 is a sectional view of a semiconductor device according to a sixth embodiment of the present invention. An n-type Si substrate 1 is used. The source electrodes 10 come into direct contact with the n-type Si substrate 1 through openings provided in the buffer layer 2 and the epitaxially grown crystal layer 5 in the active layer region 6 immediately below the source electrodes 10. The source electrodes 10 on the surface are thereby connected to the metal film 18 on the substrate back surface through the n-type Si substrate 1; the need for the source pad 14 on the insulation region 7 is eliminated and the chip pattern can be reduced in size. Also, the conduction from the source electrodes 10 to the metal film 18 through the shortest distance can be achieved. The wiring loss and inductance can thus be reduced to further improve the high-frequency characteristics.

Seventh Embodiment

Figure 8:
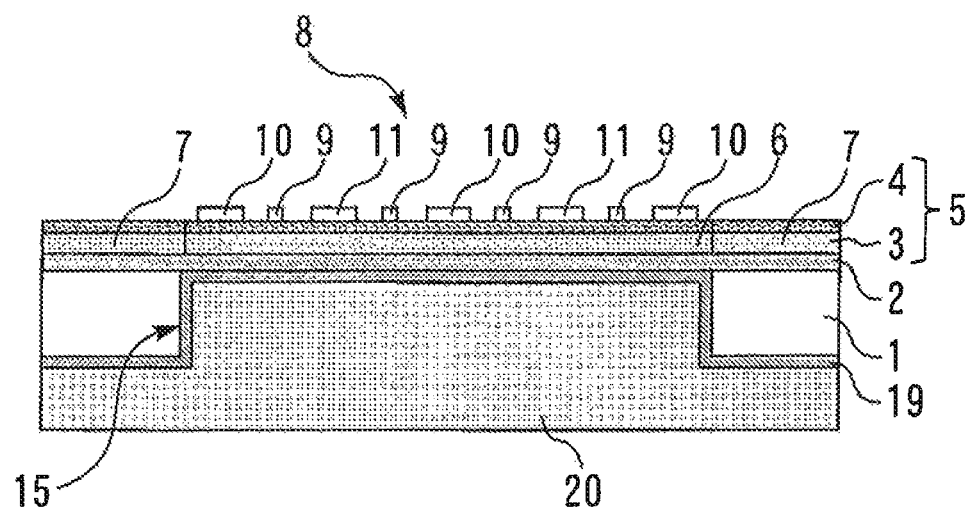
FIG. 8 is a sectional view of a semiconductor device according to a seventh embodiment of the present invention.

FIG. 8 is a sectional view of a semiconductor device according to a seventh embodiment of the present invention. The through hole 15 is filled with diamond thin film 19 and an AlN or Cu filler 20 provided in place of the AlN filler 16 in the first embodiment. The diamond thin film 19 and the filler 20 form a first layer and a second layer, respectively, in the through hole 15. Among semiconductors, diamond is excellent in insulating property and heat conductivity. Therefore, the high-frequency characteristics can be further improved and heat generated in the transistor 8 can be efficiently released. The AlN or Cu filler 2 is deposited in the second layer because filling of the through hole 15 only with diamond is costly.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-197261, filed on Sep. 24, 2013 including specification, claims, drawings and summary, on which the Convention priority of the present application is based, is incorporated herein by reference in its entirety.

What is claimed is:

1. A semiconductor device comprising:
   a Si substrate having first and second major surfaces facing in opposite directions;
   a buffer layer of $Al_xGa_{1-x}N$ ($0 \leq x \leq 1$) on the first major surface of the Si substrate;
   an epitaxially grown crystalline layer of $Al_yGa_{1-y}N$ ($0 \leq y \leq 1$, $x \neq y$) on the buffer layer;
   a transistor located on the epitaxially grown crystalline layer; and
   a filler of $Al_xGa_{1-x}N$ and having the same x as the buffer layer, wherein
   the Si substrate includes a through hole extending from the second major surface to the buffer layer, and the through hole is filled with the filler.

2. The semiconductor device according to claim 1, wherein the through hole and the filler are located opposite a drain electrode of the transistor but are not located opposite a source electrode of the transistor.

3. The semiconductor device according to claim 1, further comprising:
   a source via holed extending from the second major surface of the Si substrate to a source pad of the transistor; and
   a metal film located on an inner wall surface of the source via hole and the second major surface of the Si substrate and connected to the source pad.

4. The semiconductor device according to claim 1, wherein the Si substrate is n-type, and a source pad of the transistor comes into direct contact with the Si substrate through an opening in the buffer layer and the epitaxially grown crystalline layer, directly opposite the source pad.

5. The semiconductor device according to claim 1, wherein the Si substrate is n-type, and a source electrode of the transistor is in direct contact with the Si substrate through an opening in the buffer layer and the epitaxially grown crystalline layer, directly opposite the source electrode.

6. The semiconductor device according to claim 1, wherein resistivity of the Si substrate is not more than $10^4$ Ωcm.

7. The semiconductor device according to claim 1, wherein the buffer layer is AlN.

\* \* \* \* \*